United States Patent

Sanada

[11] Patent Number: 6,136,618
[45] Date of Patent: Oct. 24, 2000

[54] SEMICONDUCTOR DEVICE MANUFACTURING PROCESS DIAGNOSIS SYSTEM SUITABLE FOR DIAGNOSES OF MANUFACTURING PROCESS OF LOGIC LSI COMPOSED OF A PLURALITY OF LOGIC CIRCUIT BLOCKS AND DIAGNOSIS METHOD THEREOF

[75] Inventor: Masaru Sanada, Tokyo, Japan

[73] Assignee: NEC Corporation, Tokyo, Japan

[21] Appl. No.: 09/197,251

[22] Filed: Nov. 20, 1998

[30] Foreign Application Priority Data

Nov. 21, 1997 [JP] Japan ................................ 9-321738
Mar. 16, 1998 [JP] Japan ................................ 10-064913

[51] Int. Cl.$^7$ .......................... G01R 31/26; H01L 21/66
[52] U.S. Cl. ............................ 438/17; 436/14; 702/59; 714/25; 714/736; 714/724; 714/741; 324/531
[58] Field of Search ..................... 438/14, 17; 29/25.01; 702/35, 36, 58, 59; 714/2, 25, 736, 737, 741; 324/512, 527, 531, 765

[56] References Cited

U.S. PATENT DOCUMENTS 5,790,565 8/1998 Sakaguchi ........................ 714/738
5,944,847 8/1999 Sanada ........................... 714/741

FOREIGN PATENT DOCUMENTS 7-14900    1/1995  Japan .
408304514 11/1996  Japan .
9-232388   9/1997  Japan .

Primary Examiner—Richard Booth
Assistant Examiner—John Murphy
Attorney, Agent, or Firm—Scully, Scott, Murphy & Presser

[57] ABSTRACT

A semiconductor device manufacturing process diagnosis system including a visual inspection device for detecting a physically abnormal part of a semiconductor device to be diagnosed, an LSI tester for measuring electrical characteristics of a semiconductor device and a diagnosis device and characterized in that the diagnosis device extracts, from among circuit blocks constituting a semiconductor device, a block contained in a predetermined region covering a physically abnormal part, determines whether an extracted block and an abnormal block causing abnormality of electrical characteristics are the same, with respect to a block discriminated as an abnormal block, detects a position causing abnormality of electrical characteristics within the block, and depending on whether a detected position substantially coincides with a physically abnormal part, determines whether abnormality of electrical characteristics derives from physical abnormality.

27 Claims, 15 Drawing Sheets

| No. | VISUALLY ABNORMAL PART | | |
|---|---|---|---|
| | X | Y | Sise |
| 1 | 1205 | 3265 | 1.50 |
| 2 | 1889 | 6935 | 5.50 |
| 3 | — | — | — |
| 14 | 9680 | 6350 | 3.50 |

LIST OF VISUALLY ABNORMAL PART

ARRANGEMENT DIAGRAM OF DEFECTIVE PARTS ON WAFER

ONE BLOCK (B2) HAVING COORDINATES OF ORIGIN
WITHIN CONCENTRIC CIRCLE IS EXTRACTED

THREE BLOCKS (B1, B2 AND B3)
OVERLAPPING CONCENTRIC CIRCLE
ARE ALL EXTRACTED

FOUR BLOCKS (B1, B2, B3 AND B4(B7?))
HAVING COORDINATES OF ORIGIN WITHIN
CONCENTRIC CIRCLE ARE EXTRACTED

ALL BLOCKS (B1, B2, B3, B4, B5, B6, B7 AND B8) OVERLAPPING CONCENTRIC CIRCLE ARE EXTRACTED

FIG. 13

| Tvno. | Input logic |
|---|---|
| 1 | 00000 |
| 2 | 10000 |
| 3 | 10001 |
| . | . |
| . | . |
| a | F(a) | ← IDDQ ABNORMALITY
| . | . |
| . | . |
| b | F(a) | ← IDDQ ABNORMALITY
| . | F(a) | ← NORMAL
| . | . |
| . | . |

NORMAL LOGIC CIRCUIT

| Tvno. | Input logic |
|---|---|
| 1 | 00000 |
| 2 | 10000 |
| 3 | 10001 |
| . | . |
| . | . |
| a | F(a) | ← IDDQ ABNORMALITY
| . | . |
| . | . |
| b | F(a) | ← IDDQ ABNORMALITY
| . | . |
| . | . |

ABNORMAL LOGIC CIRCUIT

INDICATION OF WIRES

SEMICONDUCTOR DEVICE MANUFACTURING PROCESS DIAGNOSIS SYSTEM SUITABLE FOR DIAGNOSES OF MANUFACTURING PROCESS OF LOGIC LSI COMPOSED OF A PLURALITY OF LOGIC CIRCUIT BLOCKS AND DIAGNOSIS METHOD THEREOF

BACKGROUND OF THE INVENTION

1. Field of the Invention

The present invention relates to a semiconductor device manufacturing process diagnosis system for use in diagnoses of a manufacturing process during semiconductor manufacture and, more particularly, to a semiconductor device manufacturing process diagnosis system suitable for diagnoses of a manufacturing process of a logic LSI (Large Scale Integrated Circuit) composed of a plurality of logic circuit blocks and a diagnosis method thereof.

2. Description of the Related Art

In an LSI manufacturing line, there exists an LSI for line-monitoring for measuring and analyzing electrical characteristics of an LSI chip to be manufactured and then making the results into statistics for the purpose of improving a yield of LSIs to be manufactured. Strict examination of an electrically abnormal part within a logic LSI whose representative is an ASIC (Application Specific IC) requires a great number of steps and enormous costs. Under these circumstances, used in a conventional logic LSI manufacturing line as a line-monitoring LSI, for example, is such an LSI called TEG (Test Elementary Groups) whose analysis is easy as recited in Japanese Patent Laying-Open (Kokai) No. Heisei 7-14900, and in a line coexisting with memory, used is such a memory LSI as recited in Japanese Patent Laying-Open (Kokai) No. Heisei 9-232388.

FIG. 17 is a diagram showing one example of structure of an LSI for TEG. As illustrated in the figure, an LSI for TEG is constituted by n-stage tree structure of inverter circuits, where $2^{(n-1)}$ of output terminals OUT1 OUTm-1 exist for one input terminal IN. Then, based on occurrence conditions of logic abnormality output to the output terminals OUT1~OUTm-1, a failing part can be identified and then based on data obtained by visual inspection, identification can be made of the failing part as abnormality caused by a particle found by the visual inspection or by pattern defect (killer defect).

On the other hand, memory LSI is allowed to extract a failing storage element based on electrical characteristics. Then, a failing mode can be presumed with ease based on defective electrical characteristics because a large part of a chip (more than 80%) is occupied by storage elements. Moreover, in memory LSI production, since a few kinds are produced in quantities, it is possible to statistically grasp variation of a yield of LSIs of a kind for a long period of time. This enables optimum line-monitoring.

Since memory LSI has conventionally played a leading role in LSI technologies, monitoring a memory LSI of advanced technology can obtain representative data.

In recent years, however, there is a tendency for a logic LSI whose representative is ASIC to be a kind which plays a leading role in LSI technologies. In addition, it has become a common practice to use dedicated manufacturing lines, so that on a logic LSI manufacturing line, only logic LSIs are manufactured. As a result, the above-described conventional line-monitoring techniques have the following shortcomings.

Because LSIs vary in electric circuit structure according to their kinds, using an LSI for TEG as a line-monitoring LSI does not always lead to detection of a failure characteristic of each type and is therefore not practical. Moreover, even if an LSI for TEG is used for line-monitoring, the LSI for TEG manufactured for line-monitoring does not make a profit, resulting in increase in costs of logic LSI manufactured.

Using a memory LSI as a line-monitoring LSI does not always extract a problem characteristic of a logic LSI because a logic LSI and a memory LSI slightly differ in manufacturing processes. Manufacturing a logic LSI and a memory LSI on the same manufacturing line, therefore, involves a disadvantage of double management in line management, that is, management of a logic LSI and a memory LSI.

On the other hand, with a logic LSI used as a line-monitoring LSI, simple measurement of electrical characteristics of a logic LSI can not find which part of the logic LSI has a failure. It is therefore impossible to correlate a visually abnormal part and a failing part of a circuit. As a result, using a logic LSI as a line-monitoring LSI is also difficult.

As conventional software for discriminating a failing part of an LSI, there are, as illustrated in FIG. 18, software employing a system called reverse logic development in which a failing part is presumed through logical simulation by tracing logic from the output side toward the input side based on output abnormality information and software employing a system called failure dictionary method by which a failure within a circuit is defined and determination is made whether the failure coincides with an output failure through logical simulation.

None of the methods is, however, practical for use in line-monitoring which requires speediness because volumes of data processing and enormous simulation time are needed (e.g. 100K-gate-class LSI needs data processing of about 5 GB of data and an average of 100 hours of simulation time).

SUMMARY OF THE INVENTION

An object of the present invention is to provide a semiconductor device manufacturing process diagnosis system which eliminates the above-described conventional shortcomings and enables a logic LSI to be used for line-monitoring in a logic LSI manufacturing line and a failing part to be identified at a high speed and a diagnosis method thereof.

According to the first aspect of the invention, a semiconductor device manufacturing process diagnosis system for diagnosing a manufacturing process of a semiconductor device composed of a plurality of logic circuit blocks, comprises physically abnormal part detecting means for detecting a physically abnormal part of a semiconductor device to be diagnosed, electrical characteristics measuring means for measuring electrical characteristics of the semiconductor device, and diagnosis means for making a diagnosis on abnormality of the semiconductor device based on detection results obtained by the physically abnormal part detecting means and measurement results obtained by the electrical characteristics measuring means, the diagnosis means comprises block extracting means for extracting, from among circuit blocks constituting the semiconductor device, a block contained in a predetermined region covering a physically abnormal part detected by the physically abnormal part detecting means, abnormal block discriminating means for determining whether the block extracted by the block extraction means and an abnormal block causing abnormality of electrical characteristics of the semiconductor device coincide with each other based on electrical characteristics measured by the electrical characteristics measuring means, abnormality position detecting means for detecting, with respect to the block determined to be an abnormal block by the abnormal block discriminating means, a position causing the abnormality of electrical characteristics within the block, and failure determining means for determining, depending on whether a detection position detected by the abnormality position detecting means substantially coincides with a physically abnormal part detected by the physically abnormal part detecting means, whether abnormality of electrical characteristics caused at the detection position derives from the physical abnormality.

In the preferred construction, the block extracting means extracts the block contained in a concentric circle with a physically abnormal part detected by the physically abnormal part detecting means as the center and with a predetermined reference value as a radius.

In another preferred construction, the block extracting means, when a concentric circle with a physically abnormal part detected by the physically abnormal part detecting means as the center is sequentially magnified to have a radius as an integral multiple of a predetermined reference value and the entire region of any block is contained in the concentric circle, extracts the block contained in the concentric circle.

In another preferred construction, the block extracting means extracts the block contained in a rectangle with a physically abnormal part detected by the physically abnormal part detecting means as the center and with a predetermined reference value as one side.

In another preferred construction, the block extracting means, when a rectangle with a physically abnormal part detected by the physically abnormal part detecting means as the center is sequentially magnified to have one side as an integral multiple of a predetermined reference value and the entire region of any block is contained in the rectangle, extracts the block contained in the rectangle.

In another preferred construction, the electrical characteristics measuring means detects a leakage current in quiescence of logic for each test vector number, and the abnormal block discriminating means, when the same input logic as that to the block at a test vector number at which the leakage current is detected fails to exist in input logic of the block at a test vector number at which none of the leakage current is detected, determines that the block is the abnormal block.

In another preferred construction, the diagnosis means further comprises wire extracting means for extracting a wire between circuit blocks constituting the semiconductor device contained in a predetermined region covering a physically abnormal part detected by the physically abnormal part detecting means, and abnormal wire discriminating means for determining whether the wire extracted by the wire extracting means is an abnormal wire causing abnormality of electrical characteristics of the semiconductor device or not according to electrical characteristics measured by the electrical characteristics measuring means, and the failure determining means, depending on whether a position of the wire detected by the abnormality position detecting means substantially coincides with a physically abnormal part detected by the physically abnormal part detecting means, further determines whether abnormality of electrical characteristics caused at the position derives from the physical abnormality.

In another preferred construction, the physically abnormal part detecting means detects the physically abnormal part at each of the semiconductor device manufacturing steps, the block extracting means extracts a block corresponding to a physically abnormal part detected at any of manufacturing steps by the physically abnormal part detecting means, and the failure determining means determines a manufacturing step with the physical abnormality causing the abnormality of electrical characteristics.

In another preferred construction, the physically abnormal part detecting means detects, as physical abnormality of a semiconductor device, a visually abnormal part of the semiconductor device.

In another preferred construction, the block extracting means sets a radius of the concentric circle, with half the length of a shortest side among the sides of blocks constituting the semiconductor device as the reference value.

In another preferred construction, the block extracting means sets, with half the length of a shortest side among the sides of blocks constituting the semiconductor device as the reference value, a radius of the concentric circle to be an integral multiple of the reference value.

In another preferred construction, the block extracting means sets, with half the length of a shortest side among the sides of blocks constituting the semiconductor device as the reference value, a length of one side of the rectangle.

In another preferred construction, the block extracting means sets, with half the length of a shortest side among the sides of blocks constituting the semiconductor device as the reference value, a length of one side of the rectangle to be an integral multiple of the reference value.

According to the second aspect of the invention, a semiconductor device manufacturing process diagnosis system for diagnosing a manufacturing process of a semiconductor device composed of a plurality of logic circuit blocks, comprises a file device which stores information about circuit blocks constituting a semiconductor device to be diagnosed and information about elements constituting each of the blocks, a visual inspection device for inspecting physical abnormality of the semiconductor device, electrical characteristics measurement device for measuring electrical characteristics of the semiconductor device, and diagnosis device connected to the file device, the visual inspection device and the electrical characteristics measurement device for diagnosing a manufacturing process of the semiconductor device based on information stored in the file device, physical abnormality inspected by the visual inspection device and electrical characteristics measured by the electrical characteristics measurement device, wherein the diagnosis device extracts a physically abnormal part inspected by the visual inspection device, extracts a block of circuits constituting the semiconductor device contained in a predetermined region covering an extracted physically abnormal part, determines whether the block extracted and an abnormal block causing abnormality of electrical characteristics of the semiconductor device coincide with each other based on measurement results obtained by the electrical characteristics measurement device and information about the block stored in the file device, discriminates an element causing the abnormality of electrical characteristics within a block determined to be an abnormal block based on measurement results obtained by the electrical characteristics measurement device and information about elements constituting the block stored in the file device, obtains a position of an element determined to be causing the abnormality of electrical characteristics based on information about elements constituting the block stored in the file device, determines whether the obtained position of an element coincides with the physically abnormal part, and when the determination is made that an obtained position and the physically abnormal part coincide with each other, determines that the abnormality of electrical characteristics derives from the physical abnormality.

In the preferred construction, the file device further stores information about wire connection between the blocks, and the manufacturing process diagnosis device further extracts a wire between the blocks contained in a predetermined region covering an extracted physically abnormal part, determines whether the wire extracted is an abnormal wire causing abnormality in electrical characteristics of the semiconductor device based on measurement results obtained by the electrical characteristics measurement device and information about the block stored in the file device, determines whether the position of a wire determined to be an abnormal wire coincides with the physically abnormal part based on information about wire connection between the blocks stored in the file device, and when the determination is made that an obtained position and the physically abnormal part coincide with each other, determines that the abnormality of electrical characteristics derives from the physical abnormality.

According to the third aspect of the invention, a semiconductor device manufacturing process diagnosing method of diagnosing a manufacturing process of a semiconductor device composed of a plurality of logic circuit blocks, comprising the steps of physical abnormality position detection step of detecting a physically abnormal part of a semiconductor device to be diagnosed, electrical characteristics measurement step of measuring electrical characteristics of the semiconductor device, block extraction step of extracting a block of circuits constituting the semiconductor device contained in a predetermined region covering a physically abnormal part detected at the physical abnormality position detection step, abnormal block discrimination step of determining whether the block extracted at the block extraction step and an abnormal block causing abnormality of electrical characteristics of the semiconductor device coincide with each other based on electrical characteristics measured at the electrical characteristics measurement step, abnormality position detection step of detecting a position causing the abnormality of electrical characteristics within a block determined to be an abnormal block at the abnormal block discrimination step, and failure determination step of determining, depending on whether the position detected at the abnormality position detection step substantially coincides with a physically abnormal part detected at the physically abnormal part detection step, whether abnormality of electrical characteristics caused at the position derives from the physical abnormality.

In the preferred construction, at the block extraction step, the block is extracted which is contained in a concentric circle with a physically abnormal part detected by the physically abnormal part detecting means as the center and with a predetermined reference value as a radius.

In another preferred construction, at the block extraction step, when a concentric circle with a physically abnormal part detected by the physically abnormal part detecting means as the center is sequentially magnified to have a radius as an integral multiple of a predetermined reference value and the entire region of any block is contained in the concentric circle, the block contained in the concentric circle is extracted.

In another preferred construction, at the block extraction step, the block is extracted which is contained in a rectangle with a physically abnormal part detected by the physical abnormal part detecting means as the center and with a predetermined reference value as one side.

In another preferred construction, at the block extraction step, when a rectangle with a physically abnormal part detected by the physically abnormal part detecting means as the center is sequentially magnified to have one side as an integral multiple of a predetermined reference value and the entire region of any block is contained in the rectangle, the block contained in the rectangle is extracted.

In another preferred construction, at the electrical characteristics measurement step, a leakage current in quiescence of logic is detected for each test vector number, and at the abnormal block discrimination step, when the same input logic as that to the block at a test vector number at which the leakage current is detected fails to exist in input logic of the block at a test vector number at which none of the leakage current is detected, determination is made that the block is the abnormal block.

According to another aspect of the invention, a computer readable memory for storing a diagnosis program for diagnosing a manufacturing process of a semiconductor device composed of a plurality of logic circuit blocks by controlling a semiconductor device manufacturing process diagnosis device, the diagnosis program comprising the steps of physical abnormality position detection step of detecting a physically abnormal part of a semiconductor device to be diagnosed, electrical characteristics measurement step of measuring electrical characteristics of the semiconductor device, block extraction step of extracting a block of circuits constituting the semiconductor device contained in a predetermined region covering a physically abnormal part detected at the physical abnormality position detection step, abnormal block discrimination step of determining whether the block extracted at the block extraction step and an abnormal block causing abnormality of electrical characteristics of the semiconductor device coincide with each other based on electrical characteristics measured at the electrical characteristics measurement step, abnormality position detection step of detecting a position causing the abnormality of electrical characteristics within a block determined to be an abnormal block at the abnormal block discrimination step, and failure determination step of determining, depending on whether the position detected at the abnormality position detection step substantially coincides with a physically abnormal part detected at the physically abnormal part detection step, whether abnormality of electrical characteristics caused at the position derives from the physical abnormality.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 13 is a diagram for use in explaining a combinatorial circuit failure diagnosis method;

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
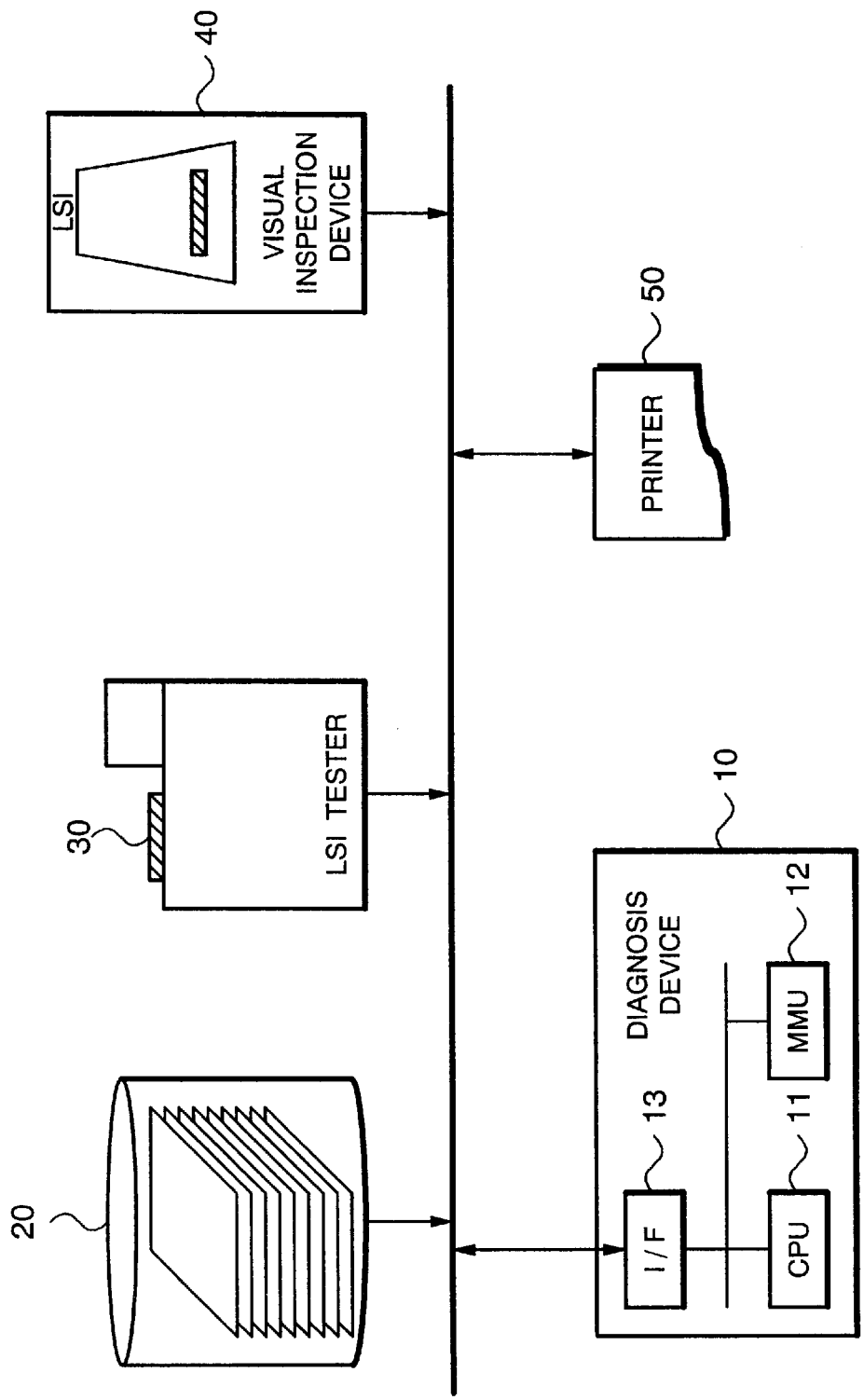
FIG. 1 is a schematic diagram showing structure of a semiconductor device manufacturing process diagnosis system according to one embodiment of the present invention.

FIG. 1 is a schematic diagram showing structure of a semiconductor device manufacturing process diagnosis system according to one embodiment of the present invention. With reference to FIG. 1, the semiconductor device manufacturing process diagnosis system of the present embodiment includes a diagnosis device 10, a file device 20, an LSI tester 30, a visual inspection device 40 and a printer 50 which are connected with each other over a network line 100. These components are provided for each LSI manufacturing line. In FIG. 1, illustration is made only of a characteristic part of the structure of the present embodiment and that of the remaining common part is omitted.

The diagnosis device 10, which is implemented by a computer system such as a personal computer or a workstation, includes a central processing unit (CPU) 11, a main memory unit (MMU) 12 and a communication interface (I/F) 13 as illustrated in FIG. 1. The CPU 11 executes a predetermined processing program for making a diagnosis on an LSI manufacturing process. The MMU 12 stores the processing program of the CPU 11 and is used as a work area of the CPU 11. The I/F 13 is connected to the network line 100 and conducts data transmission to/from the file device 20, the LSI tester 30, the visual inspection device 40 and the printer 50.

LSI manufacturing process diagnoses are made by the execution of processing with respect to data sent from the file device 20, the LSI tester 30 or the visual inspection device 40 by the CPU 11 at the diagnosis device 10 according to a predetermined processing program.

The file device 20, which is implemented by a storage device such as a magnetic disk device, stores arrangement and wiring information of each block constituting a basic logic circuit of an LSI for each kind of LSIs. This information, which is obtained from an LSI design file by CAD, is arrangement and wiring information obtained when in the designing of an electric circuit by the combination of blocks, an input terminal and an output terminal of each block are connected over a standardized wiring channel. The file device 20 also stores input/output logic information corresponding to a test vector number of each of the blocks constituting an LSI for each kind of LSIs. This is logic information of each block obtained during the verification of simulation conducted for verifying logic of a designed logic circuit. The file device 20 further stores arrangement data of elements in each block.

The LSI tester 30 examines electrical characteristics (DC characteristics, AC characteristics and IDDQ value) of each LSI formed on a wafer whose manufacturing process has all been completed by probing test.

Figure 2:
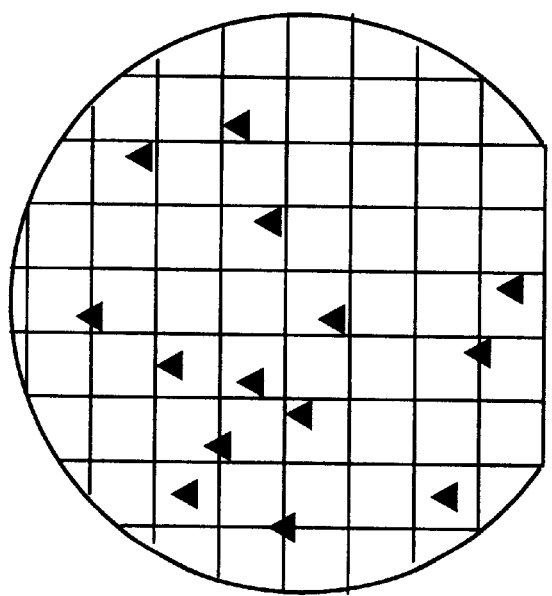
FIG. 2 is a diagram schematically showing visual abnormality inspection results obtained by a visual inspection device illustrated in FIG. 1.

The visual inspection device 40 inspects appearance of an arbitrary wafer on an LSI manufacturing line at each step. More specifically, the device inspects particles by laser scattered light detection method using He-Ne laser. Then, pattern defects are inspected by a device taking advantage of a laser depolarization phenomenon or a pattern defect inspection device employing the pattern image comparison method. The visual inspection device 40, as illustrated in FIG. 2, outputs thus inspected visual abnormality on a wafer as data of the coordinates of the center point and the size of an abnormal pattern.

The printer 50 prints and outputs results of LSI manufacturing process diagnoses by the diagnosis device 10 on paper.

With reference to the flow chart in FIG. 3 and the explanatory diagram in FIG. 4, description will be made of processing of the semiconductor device manufacturing process diagnosis system according to the present embodiment.

Figure 3:
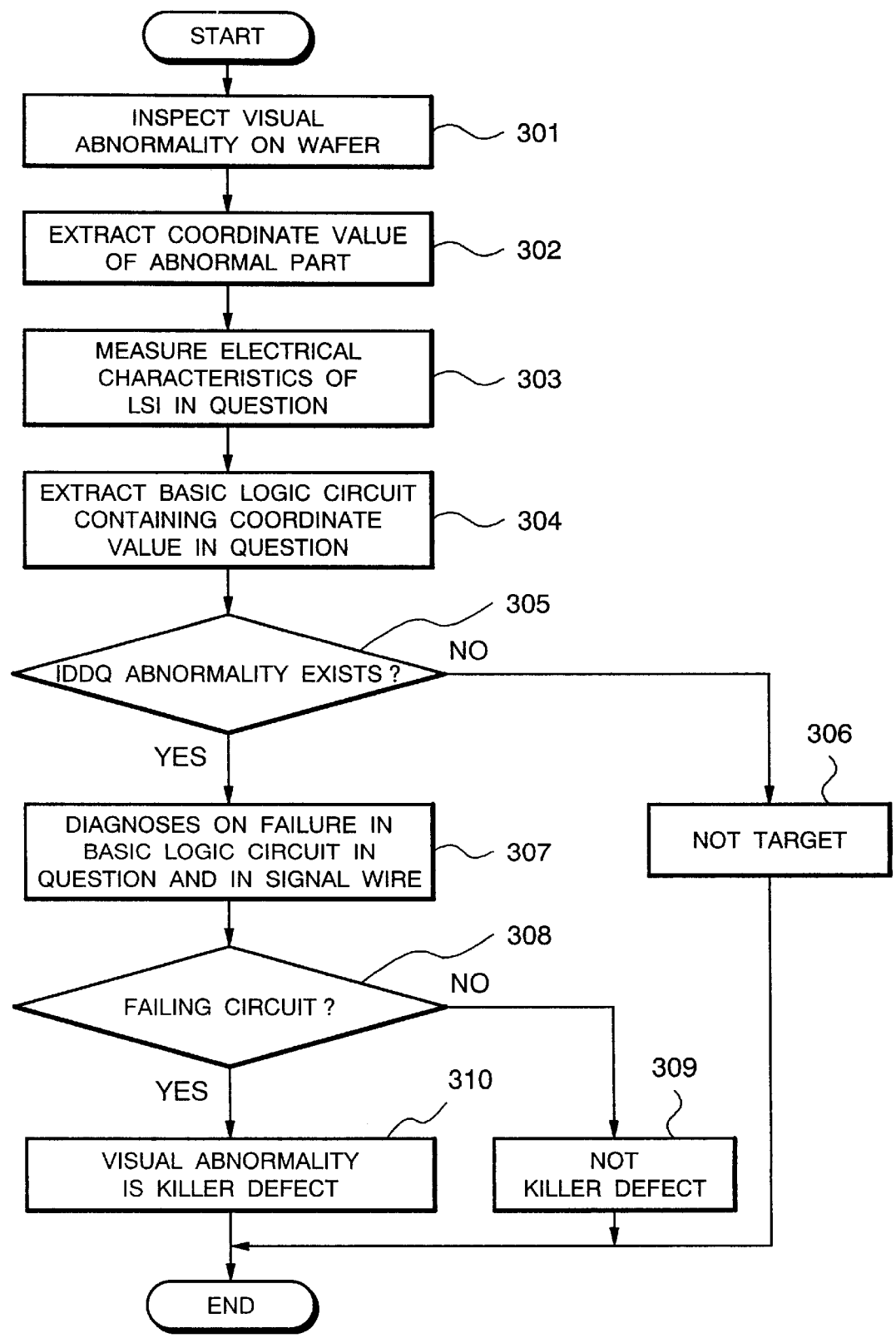
FIG. 3 is a flow chart showing an entire flow of processing by the semiconductor device manufacturing process diagnosis system according to the present embodiment.
Figure 4:
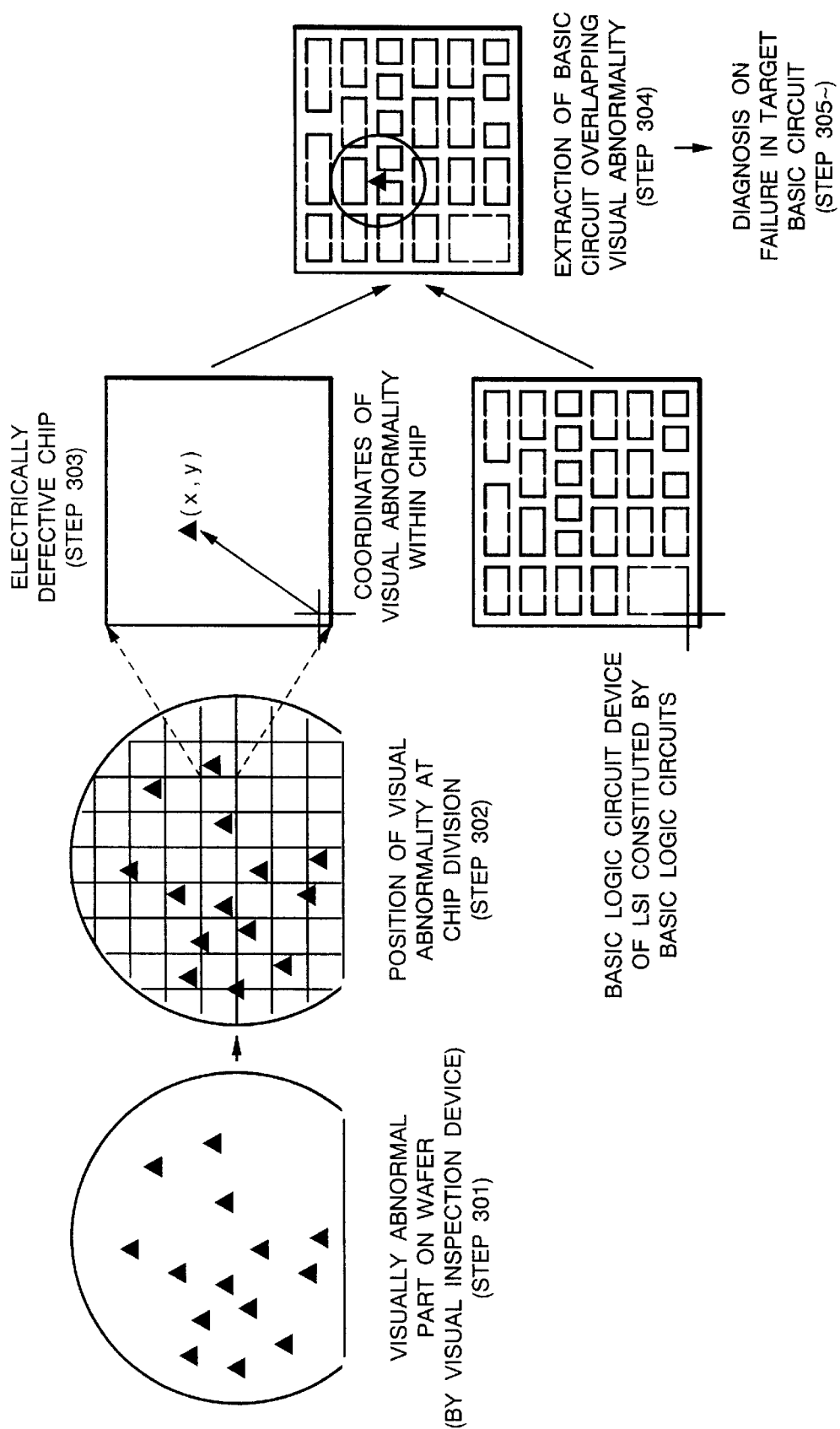
FIG. 4 is a diagram for use in explaining a diagnosis method by the semiconductor device manufacturing process diagnosis system according to the present embodiment.

With reference to FIG. 3, first, visual abnormality on the wafer is inspected by the visual inspection device 40 every time each step of the LSI manufacturing process is completed (Step 301). Next, a coordinate value of a visually abnormal part detected by the visual inspection device 40 at each step is calculated and extracted as a coordinate value of each LSI chip (Step 302). Upon completion of the formation of an electric circuit on the wafer, electrical characteristics (including IDDQ abnormality which will be described later) of each LSI chip formed on the wafer is measured by the probing test at the LSI tester 30 as will be described later (Step 303).

Next, the LSI chip whose abnormality of electrical characteristics is detected by the measurement of electrical characteristics at Step 303 and the chip whose visual abnormality is detected by the inspection at Step 301 are compared with each other by the diagnosis device 10 and when these chips are the same, a block on the LSI chip corresponding to coordinates of the visually abnormal part is extracted by the processing which will be described later (Step 304).

Next, with respect to the block extracted at Step 304, determination is made whether IDDQ abnormality exists in the relevant block or not by the processing which will be described later (Step 305). Processing following Step 305 will be conducted for each of blocks extracted at Step 304.

A block determined at Step 305 to have no IDDQ abnormality is regarded as not being a target of manufacturing process diagnoses (Step 306).

On the other hand, with respect to a block determined at Step 305 to have IDDQ abnormality, a diagnosis is made on a failure of the basic logic circuit extracted at Step 304 (Step 307). This failure diagnosis enables presumption of a failing part of internal elements constituting the basic logic circuit in question from input logic information having IDDQ abnormality as will be described later.

Next, determination is made whether the failing part presumed by the failure diagnosis made at Step 307 coincides with the position of the visual abnormality whose coordinate value is extracted at Step 302 (Step 308).

When the determination is made at Step 308 that the failing part does not coincide with the position of the visual abnormality, determination is made that the failing part presumed at Step 307 is not a killer defect to complete the processing of process diagnoses (Step 309). On the other hand, when the determination is made at Step 308 that the failing part coincides with the position of the visual abnormality, determination is made that the failing part presumed at Step 307 is a killer defect to complete the processing of process diagnoses (Step 310).

Figure 5:
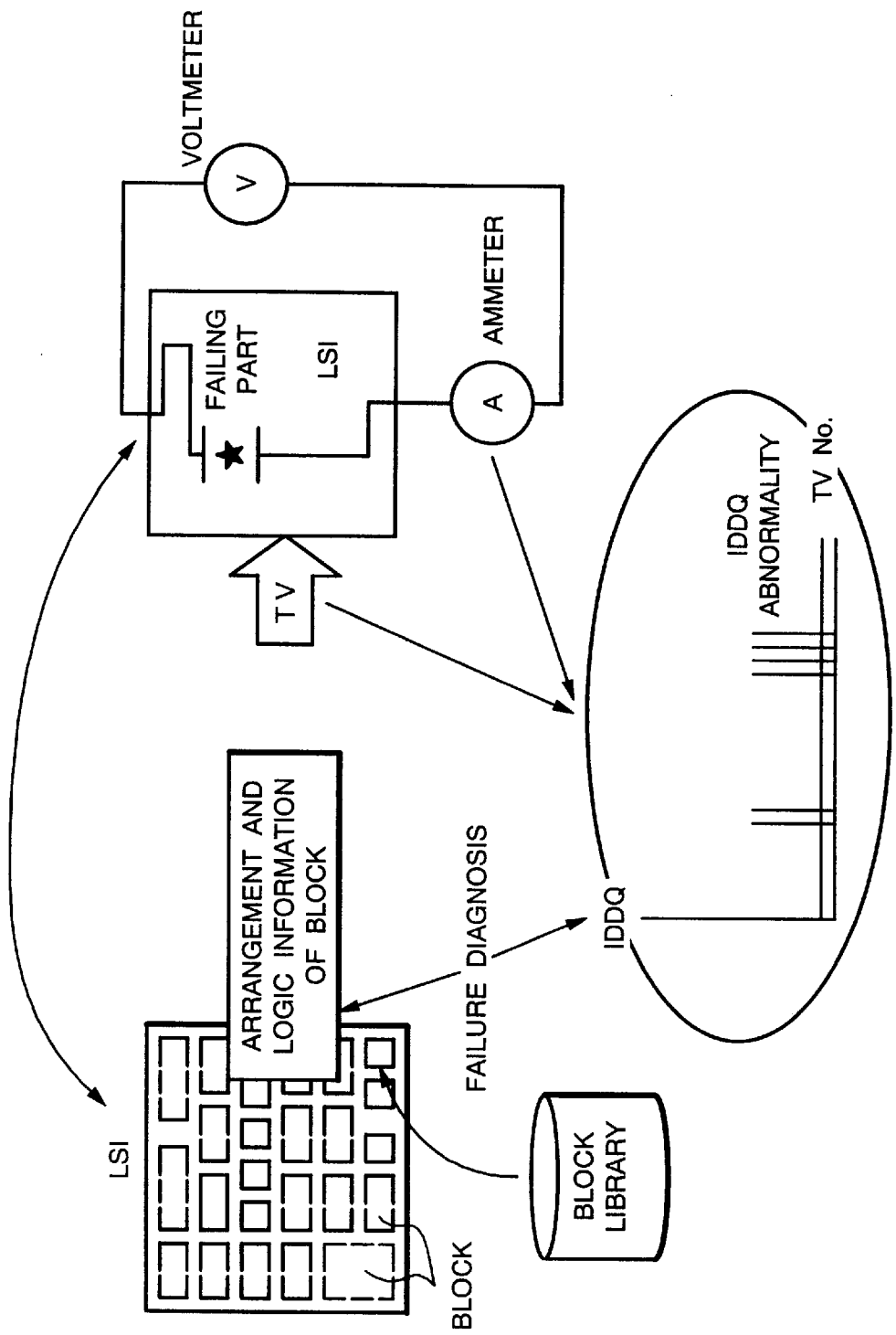
FIG. 5 is a diagram schematically showing a method of measuring an IDDQ value corresponding to a test vector number.

Detailed description will be made of measurement of electrical characteristics of each LSI chip at Step 303 with reference to FIG. 5.

Figure 11:
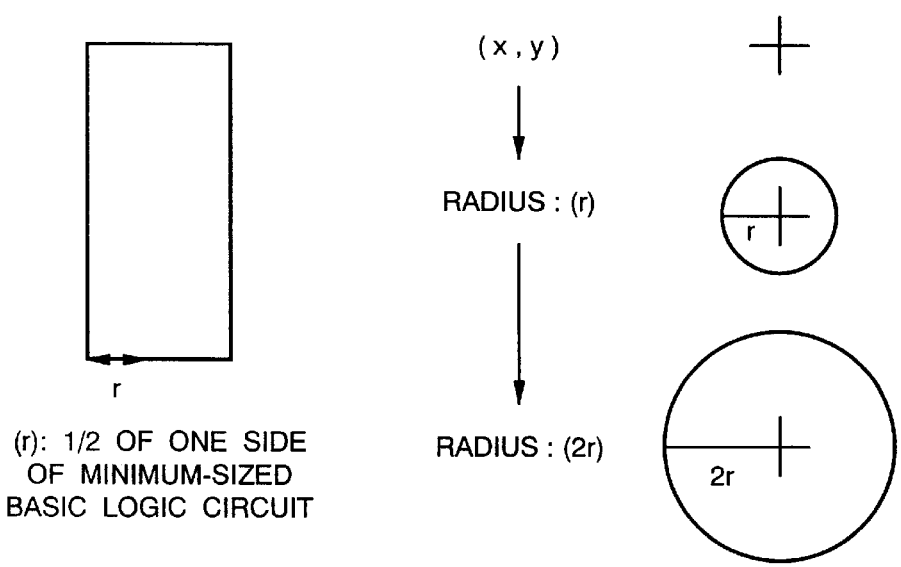
FIG. 11 is a diagram showing a concentric circle whose radius has a half length of one side of a minimum-sized block and a concentric circle whose radius has a length of the one side.

The LSI tester 30 measures, as well as DC characteristics and AC characteristics, an IDDQ value (Quiescent VDD supply current: leakage current in quiescence of logic) at each test vector number. Measurement of the IDDQ value is realized by the measurement of a leakage current (IDDQ value) at each test vector number based on arrangement and logic information of each block stored in the file device 20 as illustrated in FIG. 11. When the IDDQ value is large, determination is made that IDDQ abnormality exists.

The number of IDDQ value data required for an LSI process diagnosis is approximately 5000 successive test vectors even for an LSI with 100000 test vectors. With some LSIs having a large IDDQ value even at a normal state, IDDQ abnormality can be detected by finding a difference in IDDQ value between a defective and a non-defective.

Next, block extraction processing at Step 304 will be described in detail with reference to FIGS. 6 to 11.

Figure 6:
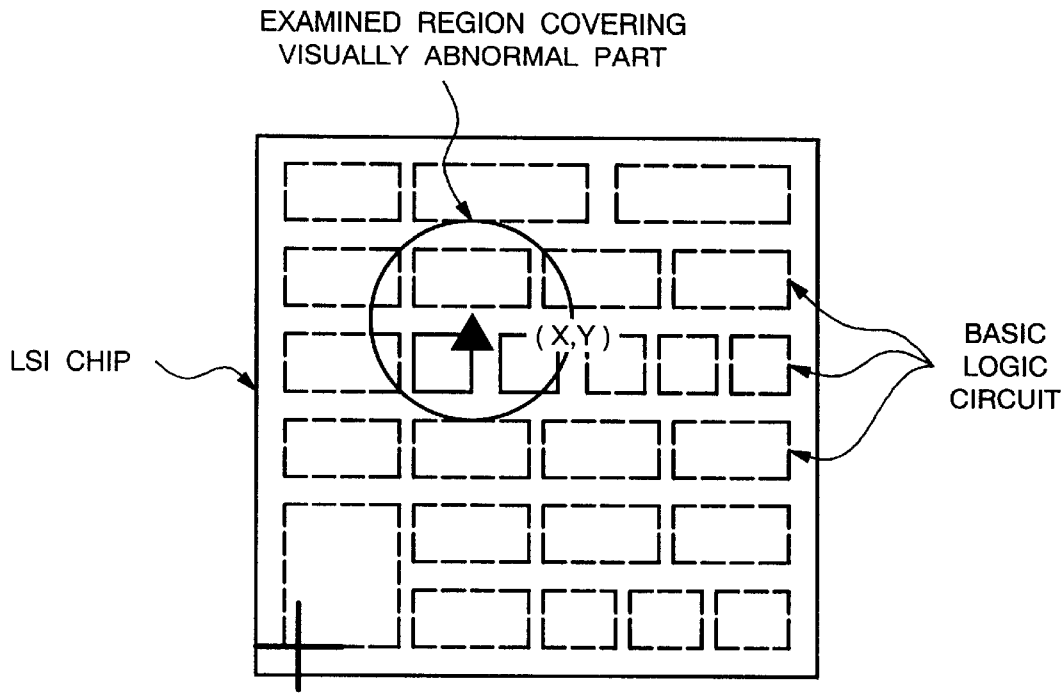
FIG. 6 is a diagram for use in explaining a basic logic circuit extraction method.

Logic LSI has an electric circuit made of a combination of blocks. Since each block differs in the number of constituent elements, connection, etc. according to its function, it varies in size. Under these circumstances, a block existing in a region surrounded by a concentric circle with center at coordinates (x,y) of a visually abnormal part as illustrated in FIG. 6 is extracted as a block containing visual abnormality.

Methods of extracting a block containing visual abnormality are, for example, the following four.

(1) Method of extracting a block whose coordinates of the origin exist within a region surrounded by a concentric circle with center at coordinates of a visually abnormal part.

Figure 7:
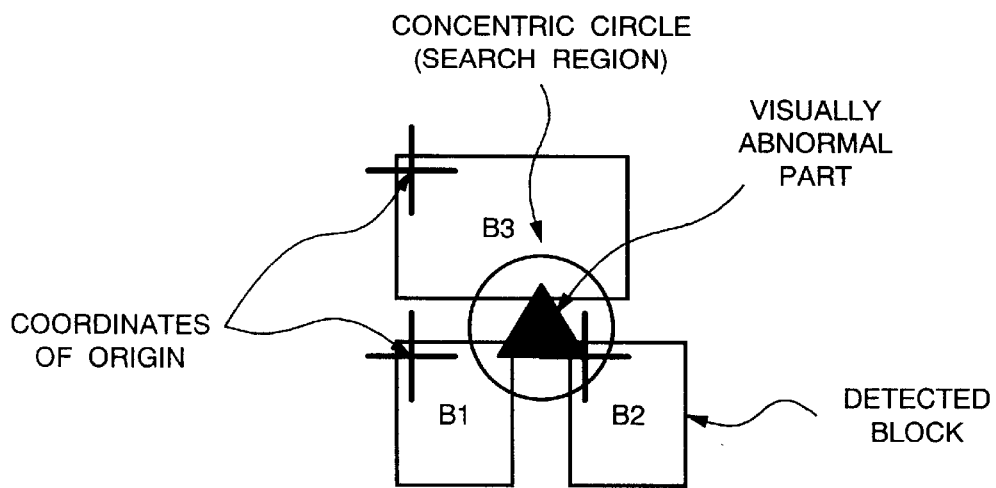
FIG. 7 is a diagram schematically showing an example of a block extraction method.

FIG. 7 shows an example of block extraction by this method and in this example, B2 is extracted as a block containing a visually abnormal part.

(2) Method of extracting a block part of which region surrounded by the origin and a diagonal point exists in a region surrounded by a concentric circle with center at coordinates of a visually abnormal part.

Figure 8:
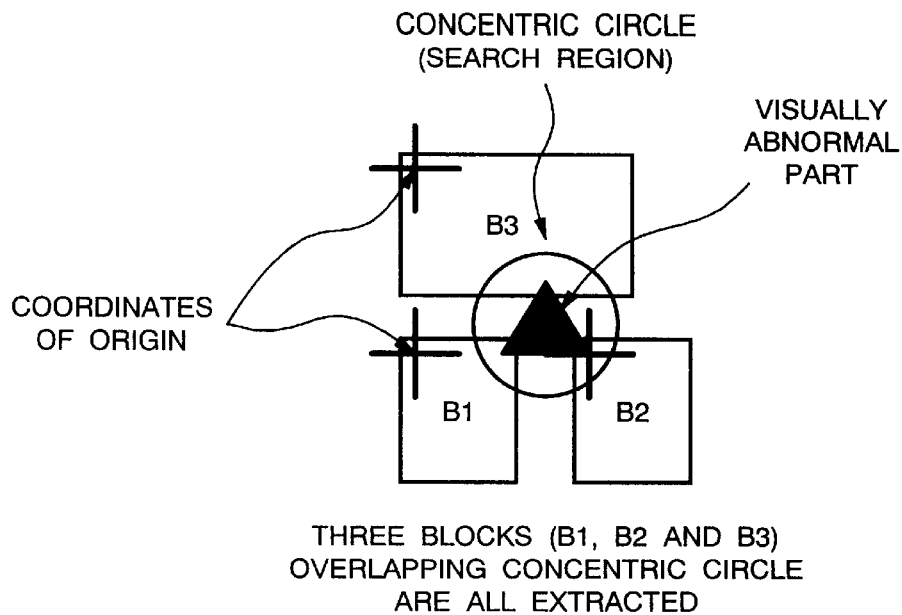
FIG. 8 is a diagram schematically showing another example of a block extraction method.

FIG. 8 shows an example of block extraction by this method and in this example, B1, B2 and B3 are extracted as blocks containing the visually abnormal part.

(3) Method of extracting a block whose origin first comes to exist in a region surrounded by a concentric circle which is obtained by sequentially magnifying a radius of the concentric circle with center at coordinates of a visually abnormal part by an integral multiple.

Figure 9:
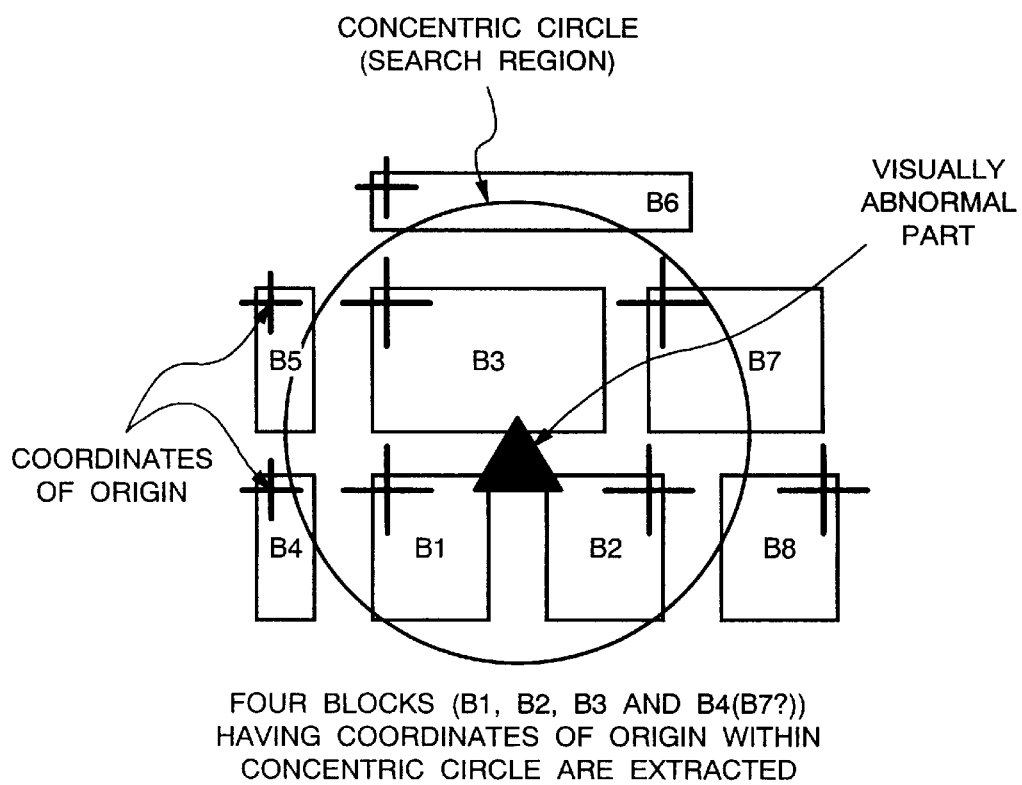
FIG. 9 is a diagram schematically showing a further example of a block extraction method.

FIG. 9 shows an example of block extraction by this method and in this example, when the radius of the concentric circle is doubled, B1, B2, B3 and B7 are extracted as blocks containing the visually abnormal part.

(4) Method of extracting, when the origin of any block first comes to exist in a region surrounded by a concentric circle which is obtained by sequentially magnifying a radius of the concentric circle with center at coordinates of a visually abnormal part by an integral multiple, a block part of which region surrounded by the origin and a diagonal point exists in the concentric circle in question.

Figure 10:
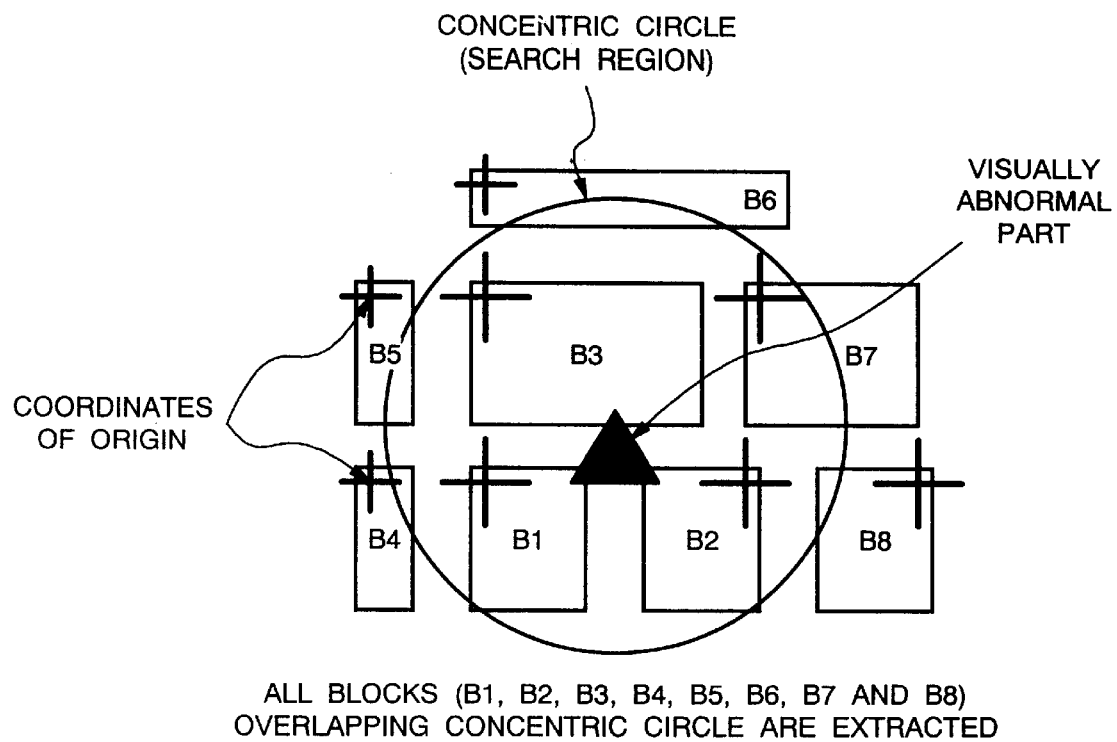
FIG. 10 is a diagram schematically showing a still further example of a block extraction method.

FIG. 10 shows an example of block extraction by this method and in this example, when the radius of the concentric circle is doubled, B1, B2, B3, B4, B5, B6 and B7 are extracted as blocks containing the visually abnormal part.

In the above-described four block extraction methods, a radius (r) of a concentric circle is set to be half of one side of a minimum-sized basic logic circuit (block) as a reference. In the above-described block extraction methods (1) and (2), a region surrounded by a concentric circle with a radius of r is regarded as a reference, while in the above-described block extraction methods (3) and (4), a region surrounded by a concentric circle with a radius of 2r is regarded as a reference.

Block extraction method is not limited to the above methods of extracting a block existing within a region surrounded by a concentric circle but may be a method of extracting a block existing within a region surrounded by a rectangle with center at coordinates of a visually abnormal part. In this case, as well as the above-described cases of (1) to (4), methods may be adopted using a rectangle with a predetermined reference value as one side or a rectangle obtained by sequentially magnifying one side of the rectangle by an integral multiple of a predetermined reference value. The reference value in this case may be also half of one side of a minimum-sized basic logic circuit (block).

Next, detailed description will be made of processing of making a diagnosis on a failure in a basic logic circuit and signal wiring at Step 307 with reference to FIGS. 12 to 16.

First, diagnoses of a block failure will be described.

Figure 12:
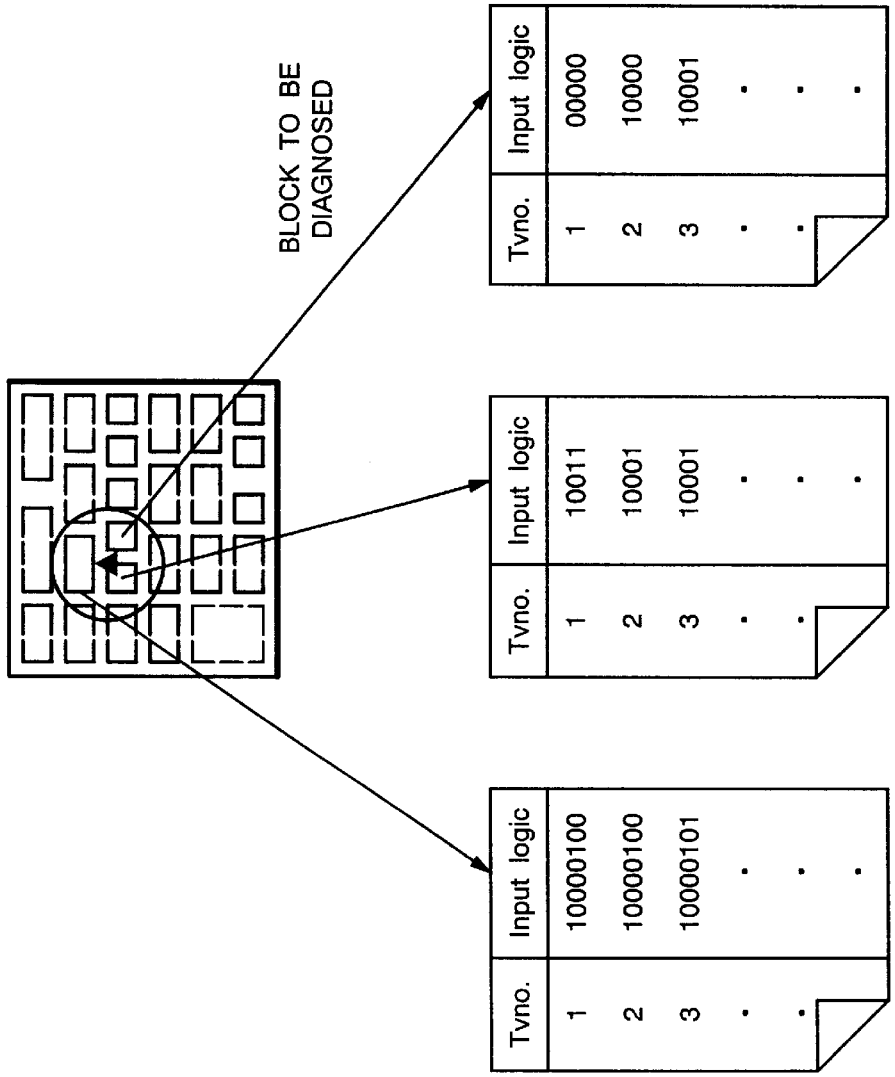
FIG. 12 is a diagram showing logic information corresponding to a test vector number of an extracted block.

FIG. 12 is a diagram showing logic information corresponding to a test vector number of an extracted block. As illustrated in the figure, for each extracted block, input logic information is checked corresponding to a test vector number stored in the file device 20. Then, a failure diagnosis of each block is made by checking whether the same logic state as that of a test vector number at which IDDQ abnormality occurs exists in logic at a normal test vector number. Here, logic LSI blocks whose failure is to be diagnosed are two kinds, a combinatorial circuit and a sequential circuit.

Combinatorial circuit has its internal logic uniformly determined for arbitrary input logic. Therefore, a diagnosis on a block failure is made by checking whether the same input logic as that of a test vector number at which IDDQ abnormality is detected exists in input logic of a test vector number with a normal IDDQ value as illustrated in FIG. 13. More specifically, when the same input logic as that of the test vector number at which IDDQ abnormality is detected exists in input logic with a normal IDDQ value, determination is made that the IDDQ abnormality derives from a failure in other block to regard the block in question as a normal block. On the other hand, when the same input logic as that of the test vector number at which IDDQ abnormality is detected fails to exist in input logic with a normal IDDQ value, determination is made that failure is contained in the block in question.

Figure 14:
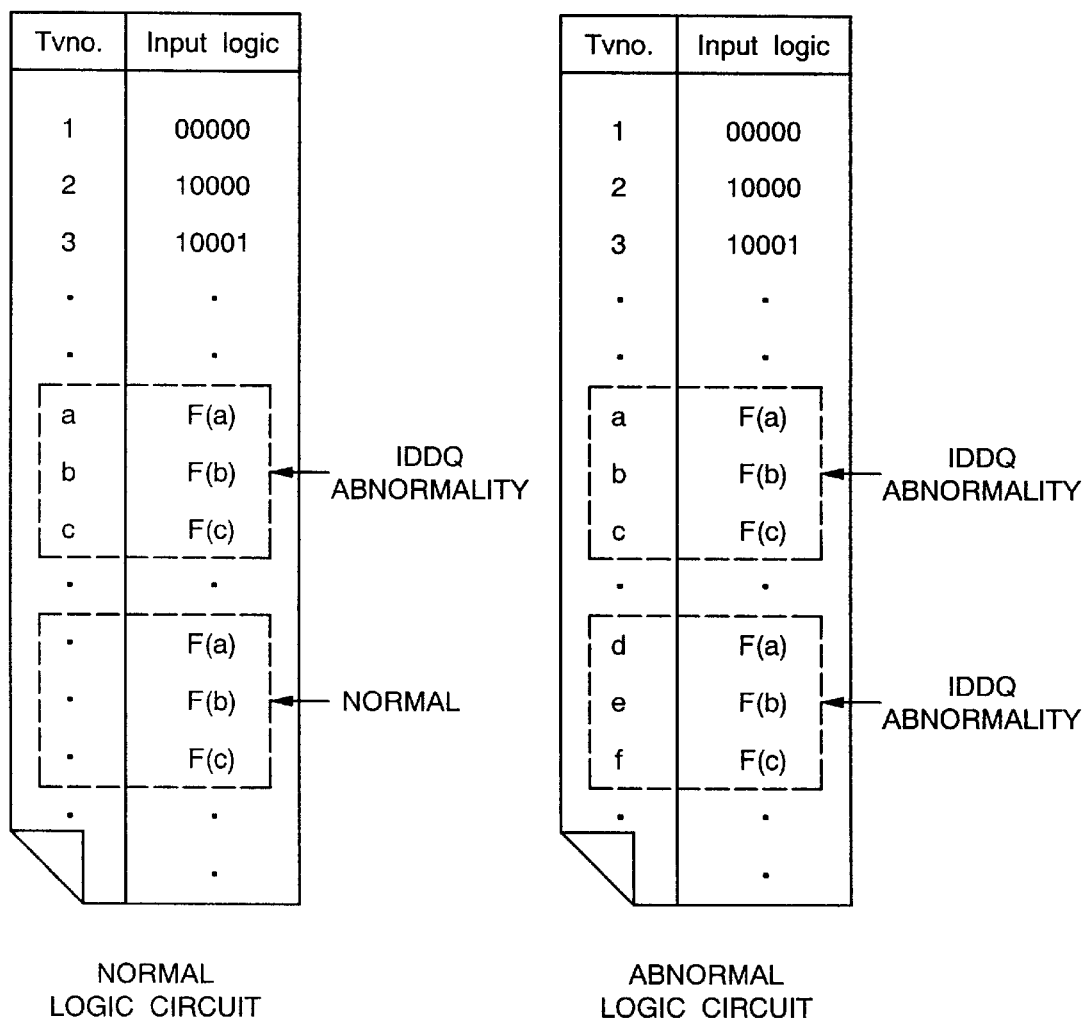
FIG. 14 is a diagram for use in explaining a sequential circuit failure diagnosis method.
Figure 15:
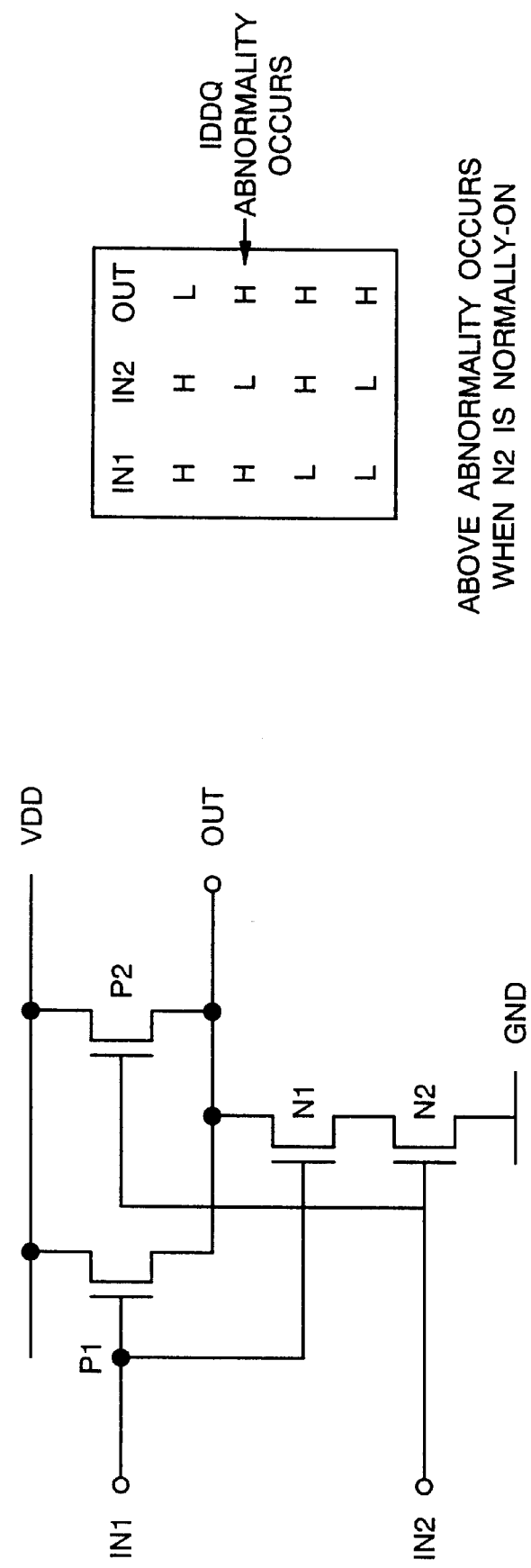
FIG. 15 is a diagram showing a two-input NAND circuit for use in explaining a method of narrowing down a failing part within a block.

Sequential circuit is characterized in receiving external data in synchronization with a clock signal and internally holding the data. Diagnosis on a failure of a block is therefore realized, as illustrated in FIG. 14, by considering a sequence of occurrence of IDDQ abnormalities as one set and checking whether the same input logic as that of a test vector number at which the set of or a single IDDQ abnormality is detected exists in input logic of a test vector number at which the set of or single IDDQ abnormality is not detected. More specifically, when the same input logic as that of a test vector number at which IDDQ abnormality is detected exists in input logic with a normal IDDQ value, determination is made that the IDDQ abnormality derives from a failure in other block to regard the block in question as a normal block. On the other hand, when the same input logic as that of a test vector number at which IDDQ abnormality is detected fails to exist in input logic with a normal IDDQ value, determination is made that the block in question contains a failure.

Next, extraction of a failing part in a block will be described.

Examining a logic state when IDDQ abnormality occurs (observation) and a logic state when no IDDQ abnormality occurs (observation) enables presumption of a failing element within a block determined to contain a failure.

Presumption of a failing element will be described. At a two-input NAND circuit illustrated in FIG. 15, for example, when input logic to input terminals IN1 and IN2 is (H,L), IDDQ abnormality is detected. On the other hand, no IDDQ abnormality occurs at other input logic (H,H), (L,H) and (L,L). In other words, it can be seen that IDDQ abnormality occurs when an N-channel transistor N2 is normally-on. Then, according to arrangement data of elements within a block stored in the file device 20, position of an element presumed to have a failure is specified.

Next, extraction of a failing part of a signal wire will be described.

Figure 16:
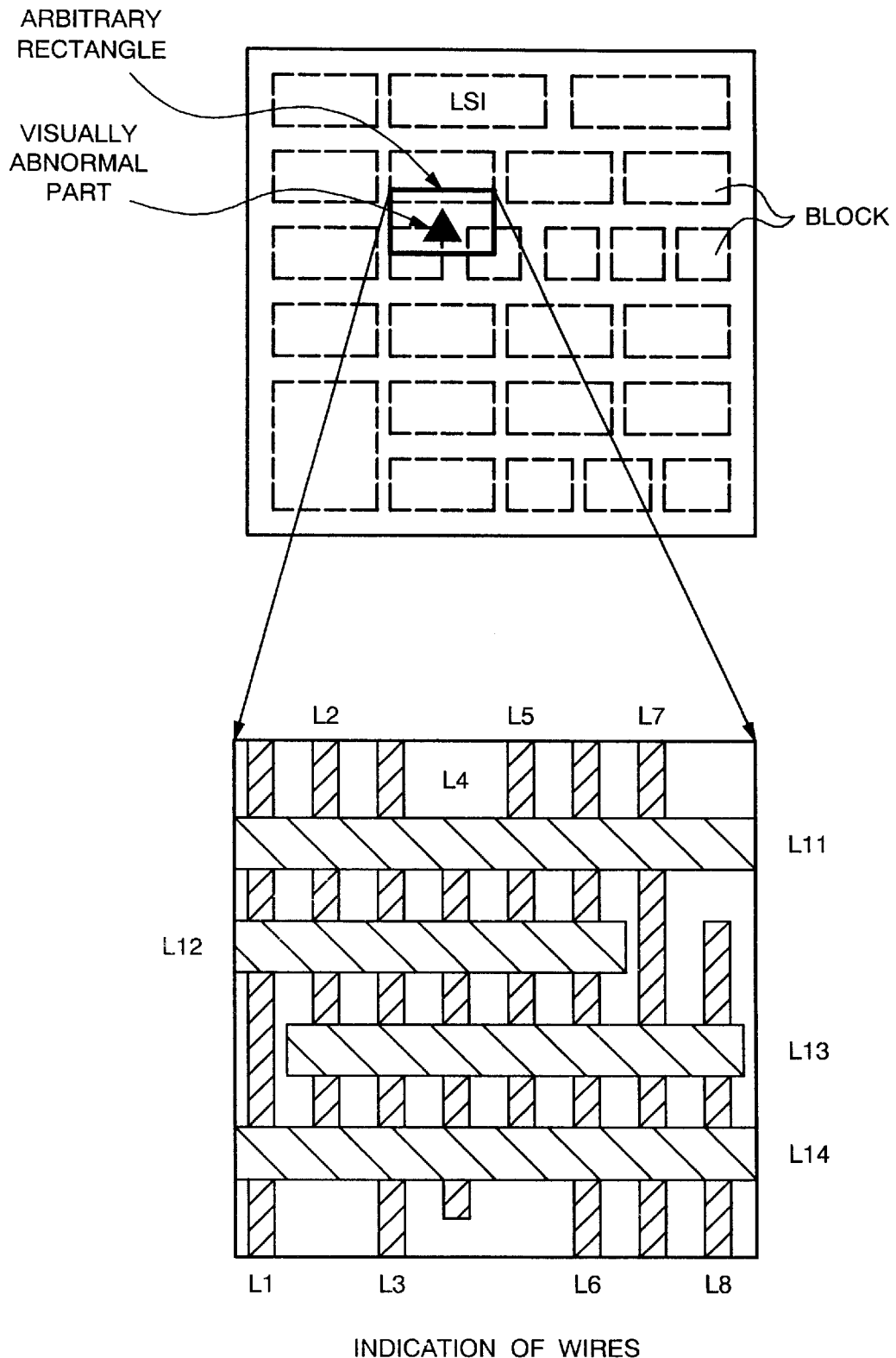
FIG. 16 is a diagram for use in explaining a method of diagnosing a failure of a signal wire between blocks.
Figure 17:
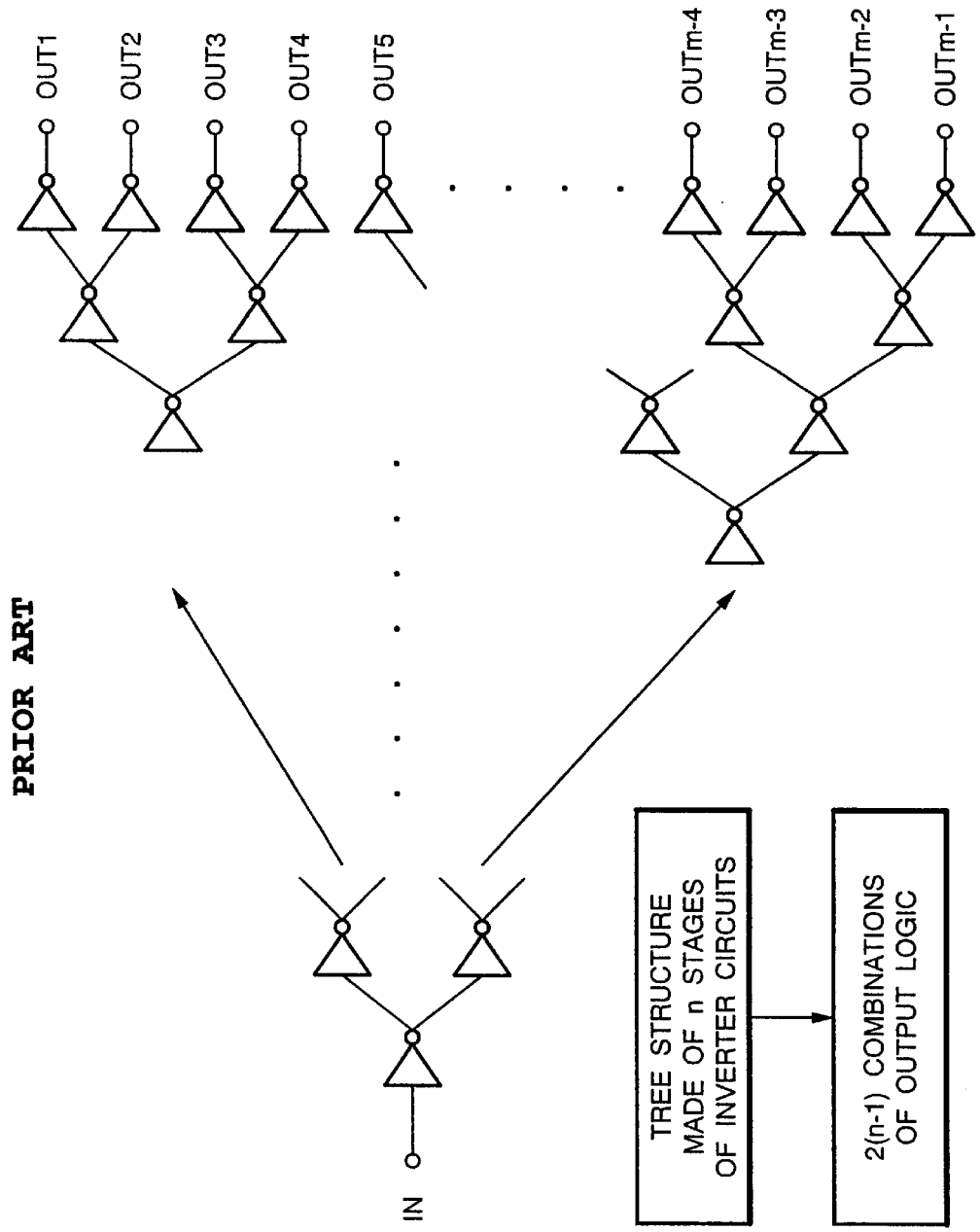
FIG. 17 is a diagram showing an example of structure of a logic circuit on an LSI for TEG.
Figure 18:
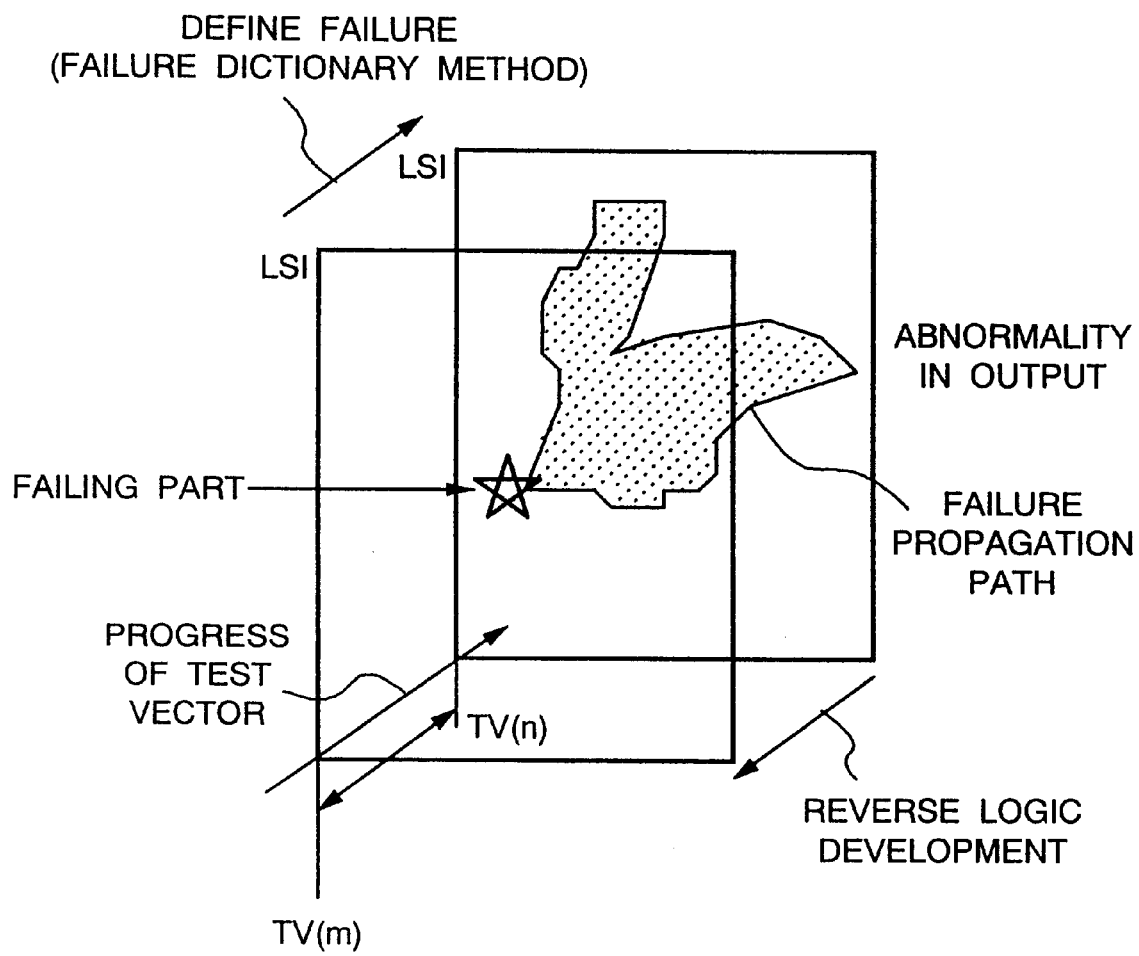
FIG. 18 is a diagram for use in explaining a system of identifying a failing part of an LSI by conventional software.

Although the above-described method enables detection of a failure contained in a block, it fails to enable detection of short circuit of a signal wire between blocks or short circuit between a signal wire between blocks and a wire within a block. Therefore, as illustrated in FIG. 16, extract a block existing within a region surrounded by an arbitrary rectangle with center at coordinates of a visually abnormal part, as well as obtaining arrangement data of a signal wire existing within the rectangle with center at coordinates of the visually abnormal part from the arrangement and wiring information stored at the file device 20. Short circuit occurs as a result of the contact between contradictory logic. It is therefore possible to extract contradictory signal wires by examining logic between signals and combination thereof at a logic state where IDDQ abnormality occurs. Also in the case of a signal wire, its position is compared with a visually abnormal part and when they coincide with each other, determination is made that it is a killer defect.

The visual inspection device 40 inspects visual abnormality on a wafer on which a logic LSI chip is formed at each step. In the processing at the diagnosis device 10, a block surrounded by a concentric circle or an arbitrary rectangle with center at coordinates of visual abnormality detected by any of inspection at each step is detected as a block containing the visual abnormality. Then, when the determination is made that it is a killer defect, identification is made which part of logic LSI manufacturing steps causes the defect.

Results of diagnoses on a logic LSI manufacturing process obtained by the foregoing processing are printed on paper and output by the printer 50.

In the above-described embodiment, appearance of a wafer is inspected by the visual inspection device 40 and a block on an LSI chip is extracted based on the detected visually abnormal part. The same effect can be achieved also by inspecting abnormality of heat or photon generated by a wafer, that is, other physical abnormalities and extracting a block on an LSI chip based on the detected physically abnormal part.

Although the foregoing embodiment has been described with respect to the application of the semiconductor device manufacturing process diagnosis system of the present invention and the diagnosis method thereof to logic LSI process diagnoses, the application to memory LSI diagnoses is possible as well.

In the above-described embodiment, an object whose process is to be diagnosed is assumed to be an LSI. The present invention is, however, applicable also to process diagnoses of such integrated circuits of lower or higher integration than LSI as IC or VLSI.

In the above-described embodiment, arrangement and wiring information of each LSI basic logic circuit (block) and input/output logic information corresponding a test vector number of each of blocks constituting the LSI are stored in the file device 20 connected to the diagnosis device 10 over the network line 100. In practice, the file device 20 may be implemented by a hard disk contained in the diagnosis device 10. In addition, a program executed by the CPU 11 of the diagnosis device 10 may be provided in the form of a CD-ROM or a floppy disk and installed in the file device 20.

As described in he foregoing, the semiconductor device manufacturing process diagnosis system of the present invention and the diagnosis method thereof enable the identification of position of a failure within a logic LSI by extracting a failing part on a block basis and then presuming a failing element within the extracted block based on its logic. It is therefore possible to use a logic LSI as a line-monitoring LSI to detect a failure characteristic of a logic LSI manufactured on the manufacturing line in question.

Allowing a logic LSI to be used as a line-monitoring LSI eliminates the need of manufacturing an unprofitable LSI for TEG for use in line-monitoring and the need of manufacturing a memory LSI on the same line and conducting double-management, thereby reducing logic LSI manufacturing costs.

Moreover, since in the semiconductor device manufacturing process diagnosis system of the present invention and the diagnosis method thereof, only the block extraction is first conducted, identification of a failing part can be made at a high speed. In addition, using only coordinates of the center point of a physically abnormal part (visually abnormal part) for block extraction more simplifies processing to speed up processing than by a system and a method taking advantage also of size.

When a yield of manufactured LSIs is small, its cause can be found quickly because of this arrangement, so that the cause can be eliminated immediately to improve the yield of LSIs to be manufactured.

Furthermore, making a region for use in block extraction rectangular simplifies algorithms for block extraction to shorten a calculation time, resulting in further speed-up of processing.

Moreover, since in the semiconductor device manufacturing process diagnosis system of the present invention and the diagnosis method thereof, an object to be extracted based on coordinates of a physically abnormal part (visually abnormal part) is a block of certain size, block to be a target of determination can be reliably extracted even when a coordinate of a detected physically abnormal part is more or less out of position. As a result, high-precision is not required of software for detecting coordinates of a visually abnormal part and processing can be conducted with simple software accordingly.

In addition, since in the semiconductor device manufacturing processing diagnosis system of the present invention and the diagnosis method thereof, visual abnormality is inspected at each step and when the abnormality is determined to be a killer defect, identification is made of a part of logic LSI manufacturing steps causing the abnormality, it is possible to find which step causes a problem and what is the cause of the problem with ease.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A computer readable memory for storing a diagnosis program for diagnosing a manufacturing process of a semiconductor device composed of a plurality of logic circuit blocks by controlling a semiconductor device manufacturing process diagnosis device, the diagnosis program comprising the steps of:

physical abnormality position detection step of detecting a physically abnormal part of a semiconductor device to be diagnosed;

electrical characteristics measurement step of measuring electrical characteristics of said semiconductor device;

block extraction step of extracting a block of circuits constituting said semiconductor device contained in a predetermined region covering a physically abnormal part detected at said physical abnormality position detection step;

abnormal block discrimination step of determining whether said block extracted at said block extraction step and an abnormal block causing abnormality of electrical characteristics of said semiconductor device coincide with each other based on electrical characteristics measured at said electrical characteristics measurement step;

abnormality position detection step of detecting a position causing said abnormality of electrical characteristics within a block determined to be an abnormal block at said abnormal block discrimination step; and failure determination step of determining, depending on whether said position detected at said abnormality position detection step substantially coincides with a physically abnormal part detected at said physically abnormal part detection step, whether abnormality of electrical characteristics caused at said position derives from said physical abnormality.

2. The computer readable memory as set forth in claim 1, wherein at said block extraction step of said diagnosis program, said block is extracted which is contained in a concentric circle with a physically abnormal part detected by said physically abnormal part detecting means as the center and with a predetermined reference value as a radius.

3. The computer readable memory as set forth in claim 1, wherein at said block extraction step of said diagnosis program, when a concentric circle with a physically abnormal part detected by said physically abnormal part detecting means as the center is sequentially magnified to have a radius as an integral multiple of a predetermined reference value and the entire region of any block is contained in said concentric circle, said block contained in said concentric circle is extracted.

4. The computer readable memory as set forth in claim 1, wherein at said block extraction step of said diagnosis program, said block is extracted which is contained in a rectangle with a physically abnormal part detected by said physically abnormal part detecting means as the center and with a predetermined reference value as one side.

5. The computer readable memory as set forth in claim 1, wherein at said block extraction step of said diagnosis program, when a rectangle with a physically abnormal part detected by said physically abnormal part detecting means as the center is sequentially magnified to have one side as an integral multiple of a predetermined reference value and the entire region of any block is contained in said rectangle, said block contained in said rectangle is extracted.

6. The computer readable memory as set forth in claim 1, wherein at said electrical characteristics measurement step of said diagnosis program, a leakage current in quiescence of logic is detected for each test vector number, and at said abnormal block discrimination step of said diagnosis program, when the same input logic as that to said block at a test vector number at which said leakage current is detected fails to exist in input logic of said block at a test vector number at which none of said leakage current is detected, determination is made that the block is said abnormal block.

7. A semiconductor device manufacturing process diagnosis system for diagnosing a manufacturing process of a semiconductor device composed of a plurality of logic circuit blocks, comprising:

physically abnormal part detecting means for detecting a physically abnormal part of a semiconductor device to be diagnosed;

electrical characteristics measuring means for measuring electrical characteristics of said semiconductor device; and diagnosis means for making a diagnosis on abnormality of said semiconductor device based on detection results obtained by said physically abnormal part detecting means and measurement results obtained by said electrical characteristics measuring means;

said diagnosis means comprising block extracting means for extracting, from among circuit blocks constituting said semiconductor device, a block contained in a predetermined region covering a physically abnormal part detected by said physically abnormal part detecting means, abnormal block discriminating means for determining whether said block extracted by said block extraction means and an abnormal block causing abnormality of electrical characteristics of said semiconductor device coincide with each other based on electrical characteristics measured by said electrical characteristics measuring means, abnormality position detecting means for detecting, with respect to said block determined to be an abnormal block by said abnormal block discriminating means, a position causing said abnormality of electrical characteristics within the block, and failure determining means for determining, depending on whether a detection position detected by said abnormality position detecting means substantially coincides with a physically abnormal part detected by said physically abnormal part detecting means, whether abnormality of electrical characteristics caused at said detection position derives from said physical abnormality.

8. The semiconductor device manufacturing process diagnosis system as set forth in claim 1, wherein said block extracting means extracts said block contained in a concentric circle with a physically abnormal part detected by said physically abnormal part detecting means as the center and with a predetermined reference value as a radius.

9. The semiconductor device manufacturing process diagnosis system as set forth in claim 1, wherein said block extracting means, when a concentric circle with a physically abnormal part detected by said physically abnormal part detecting means as the center is sequentially magnified to have a radius as an integral multiple of a predetermined reference value and the entire region of any block is contained in said concentric circle, extracts said block contained in said concentric circle.

10. The semiconductor device manufacturing process diagnosis system as set forth in claim 1, wherein said block extracting means extracts said block contained in a rectangle with a physically abnormal part detected by said physically abnormal part detecting means as the center and with a predetermined reference value as one side.

11. The semiconductor device manufacturing process diagnosis system as set forth in claim 1, wherein said block extracting means, when a rectangle with a physically abnormal part detected by said physically abnormal part detecting means as the center is sequentially magnified to have one side as an integral multiple of a predetermined reference value and the entire region of any block is contained in said rectangle, extracts said block contained in said rectangle.

12. The semiconductor device manufacturing process diagnosis system as set forth in claim 1, wherein said electrical characteristics measuring means detects a leakage current in quiescence of logic for each test vector number, and said abnormal block discriminating means, when the same input logic as that to said block at a test vector number at which said leakage current is detected fails to exist in input logic of said block at a test vector number at which none of said leakage current is detected, determines that the block is said abnormal block.

13. The semiconductor device manufacturing process diagnosis system as set forth in claim 1, wherein said diagnosis means further comprises wire extracting means for extracting a wire between circuit blocks constituting said semiconductor device contained in a predetermined region covering a physically abnormal part detected by said physically abnormal part detecting means, and abnormal wire discriminating means for determining whether said wire extracted by said wire extracting means is an abnormal wire causing abnormality of electrical characteristics of said semiconductor device or not according to electrical characteristics measured by said electrical characteristics measuring means, and said failure determining means, depending on whether a position of said wire detected by said abnormality position detecting means substantially coincides with a physically abnormal part detected by said physically abnormal part detecting means, further determines whether abnormality of electrical characteristics caused at said position derives from said physical abnormality.

14. The semiconductor device manufacturing process diagnosis system as set forth in claim 1, wherein said physically abnormal part detecting means detects said physically abnormal part at each of said semiconductor device manufacturing steps, said block extracting means extracts a block corresponding to a physically abnormal part detected at any of manufacturing steps by said physically abnormal part detecting means, and said failure determining means determines a manufacturing step with said physical abnormality causing said abnormality of electrical characteristics.

15. The semiconductor device manufacturing process diagnosis system as set forth in claim 1, wherein said physically abnormal part detecting means detects, as physical abnormality of a semiconductor device, a visually abnormal part of the semiconductor device.

16. The semiconductor device manufacturing process diagnosis system as set forth in claim 8, wherein said block extracting means sets a radius of said concentric circle, with half the length of a shortest side among the sides of blocks constituting said semiconductor device as said reference value.

17. The semiconductor device manufacturing process diagnosis system as set forth in claim 9, wherein said block extracting means sets, with half the length of a shortest side among the sides of blocks constituting said semiconductor device as said reference value, a radius of said concentric circle to be an integral multiple of the reference value.

18. The semiconductor device manufacturing process diagnosis system as set forth in claim 10, wherein said block extracting means sets, with half the length of a shortest side among the sides of blocks constituting said semiconductor device as said reference value, a length of one side of said rectangle.

19. The semiconductor device manufacturing process diagnosis system as set forth in claim 11, wherein said block extracting means sets, with half the length of a shortest side among the sides of blocks constituting said semiconductor device as said reference value, a length of one side of said rectangle to be an integral multiple of the reference value.

20. A semiconductor device manufacturing process diagnosis system for diagnosing a manufacturing process of a semiconductor device composed of a plurality of logic circuit blocks, comprising:

a file device which stores information about circuit blocks constituting a semiconductor device to be diagnosed and information about elements constituting each of said blocks;

a visual inspection device for inspecting physical abnormality of said semiconductor device;

electrical characteristics measurement device for measuring electrical characteristics of said semiconductor device; and diagnosis device connected to said file device, said visual inspection device and said electrical characteristics measurement device for diagnosing a manufacturing process of said semiconductor device based on information stored in said file device, physical abnormality inspected by said visual inspection device and electrical characteristics measured by said electrical characteristics measurement device, wherein said diagnosis device extracts a physically abnormal part inspected by said visual inspection device, extracts a block of circuits constituting said semiconductor device contained in a predetermined region covering an extracted physically abnormal part, determines whether said block extracted and an abnormal block causing abnormality of electrical characteristics of said semiconductor device coincide with each other based on measurement results obtained by said electrical characteristics measurement device and information about said block stored in said file device, discriminates an element causing said abnormality of electrical characteristics within a block determined to be an abnormal block based on measurement results obtained by said electrical characteristics measurement device and information about elements constituting said block stored in said file device, obtains a position of an element determined to be causing said abnormality of electrical characteristics based on information about elements constituting said block stored in said file device, determines whether the obtained position of an element coincides with said physically abnormal part, and when the determination is made that an obtained position and said physically abnormal part coincide with each other, determines that said abnormality of electrical characteristics derives from said physical abnormality.

21. The semiconductor device manufacturing process diagnosis system as set forth in claim 20, wherein said file device further stores information about wire connection between said blocks, and said manufacturing process diagnosis device further extracts a wire between said blocks contained in a predetermined region covering an extracted physically abnormal part, determines whether said wire extracted is an abnormal wire causing abnormality in electrical characteristics of said semiconductor device based on measurement results obtained by said electrical characteristics measurement device and information about said block stored in said file device, determines whether the position of a wire determined to be an abnormal wire coincides with said physically abnormal part based on information about wire connection between said blocks stored in said file device, and when the determination is made that an obtained position and said physically abnormal part coincide with each other, determines that said abnormality of electrical characteristics derives from said physical abnormality.

22. A semiconductor device manufacturing process diagnosing method of diagnosing a manufacturing process of a semiconductor device composed of a plurality of logic circuit blocks, comprising the steps of:

physical abnormality position detection step of detecting a physically abnormal part of a semiconductor device to be diagnosed;

electrical characteristics measurement step of measuring electrical characteristics of said semiconductor device;

block extraction step of extracting a block of circuits constituting said semiconductor device contained in a predetermined region covering a physically abnormal part detected at said physical abnormality position detection step;

abnormal block discrimination step of determining whether said block extracted at said block extraction step and an abnormal block causing abnormality of electrical characteristics of said semiconductor device coincide with each other based on electrical characteristics measured at said electrical characteristics measurement step;

abnormality position detection step of detecting a position causing said abnormality of electrical characteristics within a block determined to be an abnormal block at said abnormal block discrimination step; and failure determination step of determining, depending on whether said position detected at said abnormality position detection step substantially coincides with a physically abnormal part detected at said physically abnormal part detection step, whether abnormality of electrical characteristics caused at said position derives from said physical abnormality.

23. The semiconductor device manufacturing process diagnosing method as set forth in claim 22, wherein at said block extraction step, said block is extracted which is contained in a concentric circle with a physically abnormal part detected by said physically abnormal part detecting means as the center and with a predetermined reference value as a radius.

24. The semiconductor device manufacturing process diagnosing method as set forth in claim 22, wherein at said block extraction step, when a concentric circle with a physically abnormal part detected by said physically abnormal part detecting means as the center is sequentially magnified to have a radius as an integral multiple of a predetermined reference value and the entire region of any block is contained in said concentric circle, said block contained in said concentric circle is extracted.

25. The semiconductor device manufacturing process diagnosing method as set forth in claim 22, wherein at said block extraction step, said block is extracted which is contained in a rectangle with a physically abnormal part detected by said physical abnormal part detecting means as the center and with a predetermined reference value as one side.

26. The semiconductor device manufacturing process diagnosing method as set forth in claim 22, wherein at said block extraction step, when a rectangle with a physically abnormal part detected by said physically abnormal part detecting means as the center is sequentially magnified to have one side as an integral multiple of a predetermined reference value and the entire region of any block is contained in said rectangle, said block contained in said rectangle is extracted.

27. The semiconductor device manufacturing process diagnosing method as set forth in claim 22, wherein at said electrical characteristics measurement step, a leakage current in quiescence of logic is detected for each test vector number, and at said abnormal block discrimination step, when the same input logic as that to said block at a test vector number at which said leakage current is detected fails to exist in input logic of said block at a test vector number at which none of said leakage current is detected, determination is made that the block is said abnormal block.

* * * * *

UNITED STATES PATENT AND TRADEMARK OFFICE
CERTIFICATE OF CORRECTION

PATENT NO. : 6,136,618
DATED : October 24, 2000
INVENTOR(S) : M. Sanada

Page 1 of 1

It is certified that error appears in the above-identified patent and that said Letters Patent is hereby corrected as shown below:

Column 16, claim 8,
Line 12, "Claim 1" should read -- Claim 7 --

Column 16, claim 9,
Line 20, "Claim 1" should read -- Claim 7 --

Column 16, claim 10,
Line 30, "Claim 1" should read -- Claim 7 --

Column 16, claim 11,
Line 37, "Claim 1" should read -- Claim 7 --

Column 16, claim 12,
Line 48, should read -- Claim 7 --

Column 16, claim 13,
Line 60, "Claim 1" should read -- Claim 7 --

Column 17, claim 14,
Line 15, "Claim 1" should read -- Claim 7 --

Column 17, claim 15,
Line 29, "Claim 1" should read -- Claim 7 --

Signed and Sealed this

Twenty-second Day of January, 2002

Attest:

JAMES E. ROGAN
*Attesting Officer*     *Director of the United States Patent and Trademark Office*